United States Patent
Fasano et al.

(10) Patent No.: US 8,940,550 B1
(45) Date of Patent: Jan. 27, 2015

(54) MAINTAINING LAMINATE FLATNESS USING MAGNETIC RETENTION DURING CHIP JOINING

(71) Applicant: International Business Machines Corporation, Armonk, NY (US)

(72) Inventors: Benjamin V. Fasano, New Windsor, NY (US); Shidong Li, Poughkeepsie, NY (US); Thomas Weiss, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/972,981

(22) Filed: Aug. 22, 2013

(51) Int. Cl.
*H01L 21/603* (2006.01)
*H01L 23/00* (2006.01)
*H01L 21/48* (2006.01)
*H01L 23/492* (2006.01)

(52) U.S. Cl.
CPC ............ *H01L 24/11* (2013.01); *H01L 21/4878* (2013.01); *H01L 23/492* (2013.01)
USPC ................................ 438/3; 438/108; 438/615

(58) Field of Classification Search
USPC .......................................................... 438/457
See application file for complete search history.

(56) References Cited

U.S. PATENT DOCUMENTS

| | | | |
|---|---|---|---|
| 3,887,997 A | 6/1975 | Hartleroad et al. | |
| 5,373,627 A | 12/1994 | Grebe | |
| 5,447,886 A | 9/1995 | Rai | |
| 5,892,287 A | 4/1999 | Hoffman et al. | |
| 5,986,348 A | 11/1999 | Fukano | |
| 6,069,026 A | 5/2000 | Terrill et al. | |
| 6,406,988 B1 | 6/2002 | Chung | |
| 6,894,592 B2 | 5/2005 | Shen et al. | |
| 7,807,501 B1 * | 10/2010 | Zhang | 438/108 |

OTHER PUBLICATIONS

Kikuchi et al., "High-Performance FCBGA Based on Ultra-Thin Packaging Substrate," NEC J. of Adv. Tech., Summer 2005.
Kivilahti et al., "Panel-Size Component Integration (PCI) with Molded Liquid Crystal Polymer (LCP) Substrates," 2002 Electronic Components and Technology Conference.

* cited by examiner

*Primary Examiner* — Stephen W Smoot
(74) *Attorney, Agent, or Firm* — L. Jeffrey Kelly; Steven Meyers

(57) ABSTRACT

Methods for preventing warpage of a laminate may include placing the laminate on a back plate and applying a magnetic force to the laminate to hold the laminate flat against the back plate. In some embodiments, the magnetic force may be applied by placing a first magnet above the laminate so that an attractive force generated between the first magnet and a ferromagnetic region of the back plate pulls the first magnet against the laminate, thereby holding the laminate flat against the back plate. In other embodiments, the magnetic force may be applied by placing a first magnet above the laminate and placing a second magnet above the first magnet so that a repulsive force generated between the first magnet and the magnet pushes the first magnet against the laminate, thereby holding the laminate flat against the back plate.

19 Claims, 10 Drawing Sheets

MAINTAINING LAMINATE FLATNESS USING MAGNETIC RETENTION DURING CHIP JOINING

BACKGROUND

The present invention relates to methods of joining a microelectronic chip to a laminate, and particularly to methods of using magnets to maintain laminate flatness while joining the microelectronic chip to the laminate.

FIG. 1A depicts an exemplary process of joining a microelectronic chip 20 to a laminate 10 by, for example, a plurality of solder balls 30. To improve the electrical connection between the microelectronic chip 20 and the laminate 10 through the solder balls 30 a reflow process may be used, as depicted in FIG. 1B. During the reflow process, thermal stress may cause warpage of the laminate 10. Laminate warpage or warping may be defined by the laminate's curvature from a flat surface of the bottom of the laminate. Alternatively, laminate warpage may be measured relative to a planar surface mating with the bottom of the laminate.

Particularly as organic laminates grow thinner, the degree of laminate warpage may grow to undesirable levels. Among negative effects, laminate warpage may lead to opens where the laminate is no longer joined to all of the solder balls, as depicted in FIG. 1B, or shorts where adjacent solder balls come into contact. Warpage may further result in cracking of the laminate or separation of the dielectric layers within the laminate. Increased laminate warpage during die reflow can also lead to increased module warpage at the end of a bond and assembly process, which can cause the module to fail final co-planarity specifications It would therefore be desirable to provide an apparatus and method for maintaining laminate flatness throughout the chip joining process, particularly during solder reflow.

SUMMARY

According to one embodiment, laminate warpage may be prevented by placing a laminate on a back plate, and then applying a magnetic force to the laminate using a first magnet so that the magnetic force holds the laminate flat against the back plate. The magnetic force may be applied by placing a first magnet above the laminate so that an attractive force generated between the first magnet and a ferromagnetic region of the back plate pulls the first magnet against the laminate, thereby holding the laminate flat against the back plate. The magnetic force may alternatively be applied by placing a first magnet above the laminate and placing a second magnet above the first magnet so that a repulsive force generated between the first magnet and the magnet pushes the first magnet against the laminate, thereby holding the laminate flat against the back plate.

In another embodiment, laminate warpage may be prevented during a chip-joining process by placing a laminate on a back plate containing a ferromagnetic region; placing a microelectronic chip above the laminate; placing a plurality of solder balls between the microelectronic chip and the laminate; placing a magnet carrier, including a plurality of carrier legs and a magnet held above laminate by the plurality of carrier legs, on the laminate, so that an attractive force generated between the magnet of the magnet carrier and the ferromagnetic region of the base plate pulls the magnet carrier against the laminate. The solder balls may then be melted at a temperature less than the Curie temperatures of magnet to join the microelectronic chip and the laminate.

In another embodiment, laminate warpage may be prevented during a chip-joining process by placing a laminate on a back plate, placing a microelectronic chip above the laminate; placing a plurality of solder balls between the microelectronic chip and the laminate, placing a first magnet above the laminate, and placing a second magnet above the first magnet, so that a repulsive force generated between the first magnet and the second magnet pushes the first magnet against the laminate. The solder balls may then be melted at a temperature less than the Curie temperatures of the first magnet and the second magnet to join the microelectronic chip and the laminate.

Figure 1A:
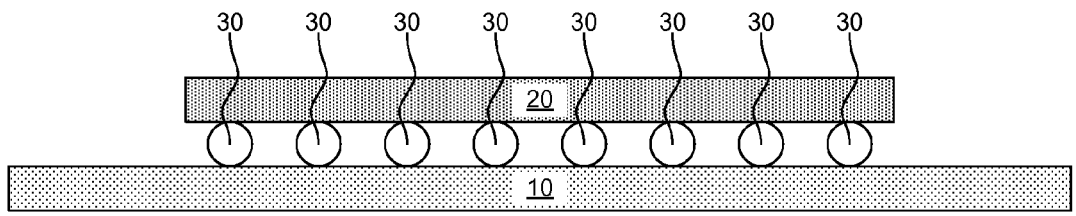
FIG. 1A is a side view a chip joined to a laminate by a plurality of solder bumps, according to the prior art.
Figure 1B:
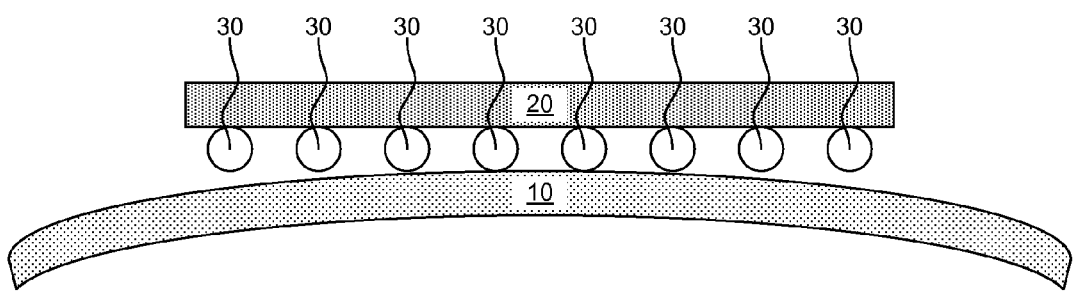
FIG. 1B is a cross-sectional view of a warped laminate, according to the prior art.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. The terms "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As described below in conjunction with FIGS. 2A-7C, embodiments of the invention are generally relate to methods of maintaining laminate flatness during a chip join process by placing magnets above the laminate that hold the laminate flat against a magnetic backing plate. Referring to FIGS. 2A-5B and 7A-7B, figures with the suffix "A" are top down views of an exemplary structure at each step of the fabrication process. Figures with the suffix "B" or "C" are cross-sectional views of the exemplary structure along the plane indicated by line B-B or line C-C, respectively, of the corresponding figure with the same numeric label and the suffix "A".

Figure 2A:
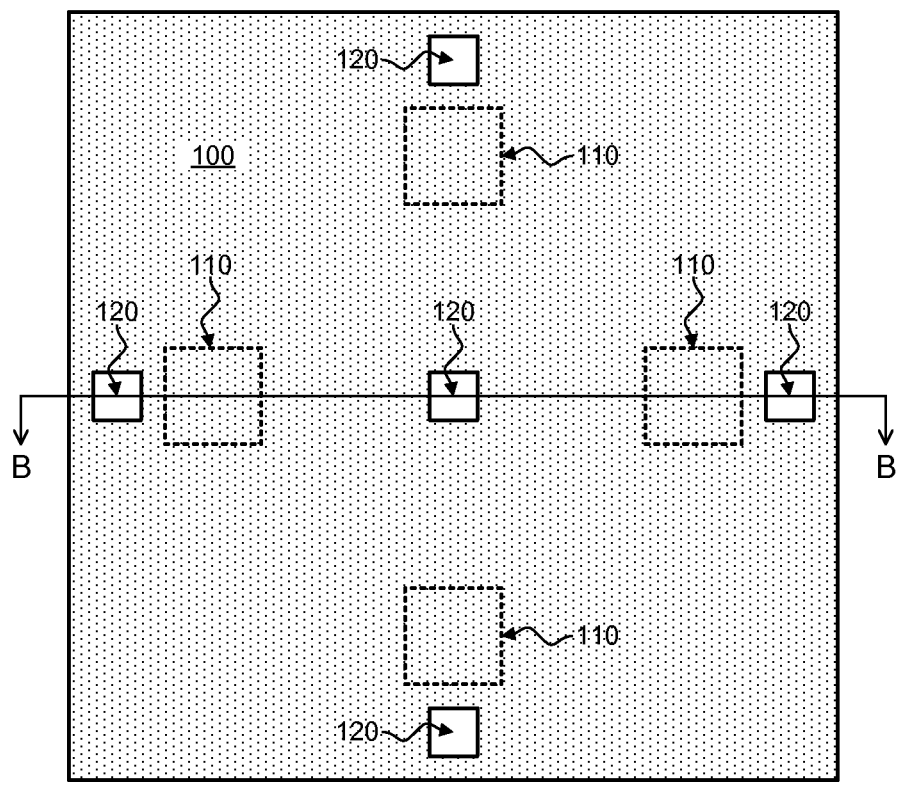
FIG. 2A is a top view of a backing plate, according to an embodiment of the present invention.
Figure 2B:
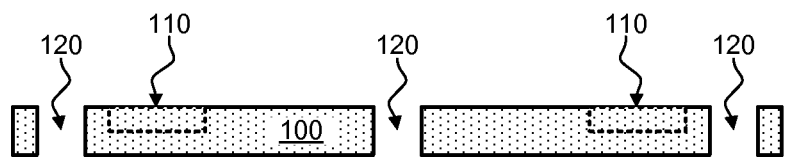
FIG. 2B is a cross-sectional view of the backing plate of FIG. 2A, according to an embodiment of the present invention.

Referring to FIGS. 2A-2B, a base plate 100 may be provided. The base plate 100 may be made of any material capable of supporting a laminate 200 (FIG. 3A) described below in conjunction with FIGS. 3A-3B during the reflow process described below in conjunction with FIGS. 5A-5B. In an exemplary embodiment, the base plate 100 may be made of insulating material such as a temperature-resistant plastic or a metal such as steel or aluminum. The base plate 100 may contain one or more ferromagnetic (i.e., attracted to magnets) regions 110. In some embodiments, the ferromagnetic regions 110 may be made of ferromagnetic materials embedded in a non-ferromagnetic base plate 100. In other embodiments, portions of base plate 100 may be ferromagnetic. In further embodiments, the entire base plate 100 may be ferromagnetic. In some embodiments, the base plate 100 may further include one or more vacuum holes 120 to further hold the laminate 200 (FIG. 3A) against the base plate 100.

Figure 3A:
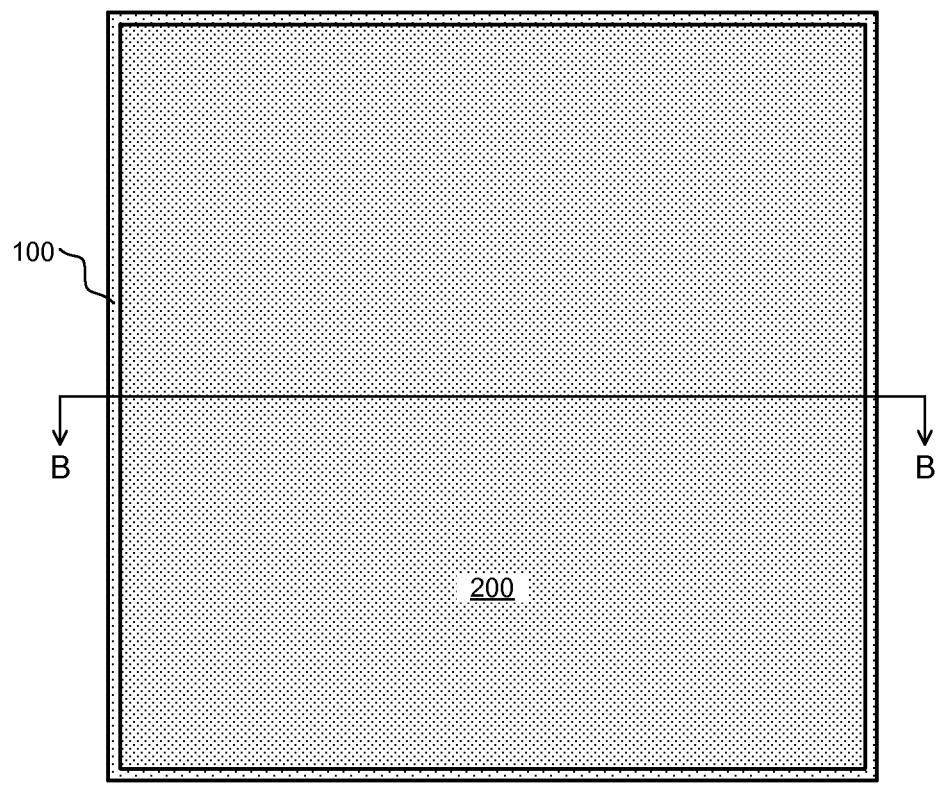
FIG. 3A is a top view of a laminate on the backing plate, according to an embodiment of the present invention.
Figure 3B:
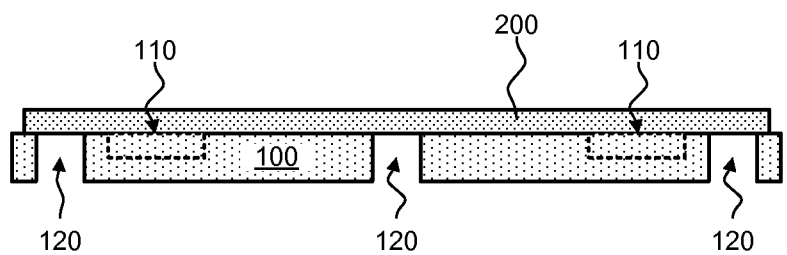
FIG. 3B is a cross-sectional view of the backing plate and the laminate of FIG. 3A, according to an embodiment of the present invention.

Referring to FIGS. 3A-3B, the laminate 200 may be placed above the base plate 100. To hold the laminate 200 to the base plate 100, a vacuum may optionally be applied to the vacuum holes 120. The laminate 200 may contain layers of both conductive metallurgy and dielectric materials, and may contain a particle- or glass-fiber filled core. In some embodiments, the laminate 200 may be coreless. The laminate 200 may have a thickness of approximately 0.3 mm to approximately 3 mm, though greater and lesser thicknesses are explicitly contemplated. The base plate 100 may be sized so that the laminate 200 fits above the base plate 100. Typically, the laminate 200 may have an area of approximately 55 mm², though larger and smaller laminates are explicitly contemplated. While the base plate 100 depicted in FIGS. 3A-3B is sized to support only a single laminate 200, the base plate 100 may be substantially larger to support more than one laminate at the same time.

Figure 4A:
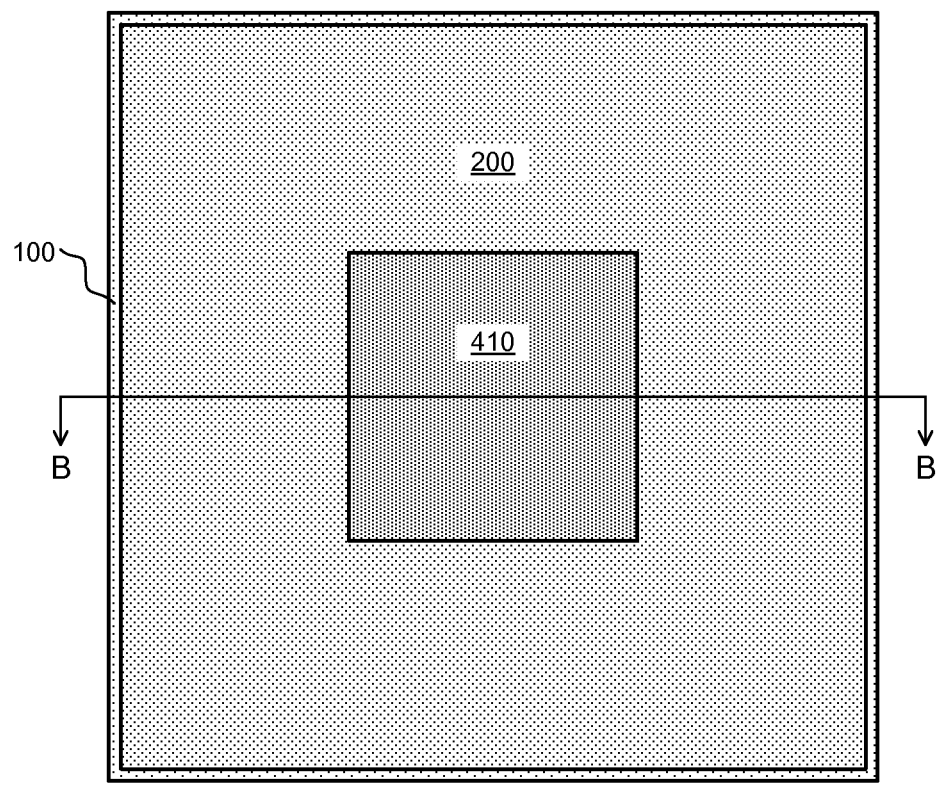
FIG. 4A is a top view of a chip joined to the laminate, according to an embodiment of the present invention.
Figure 4B:
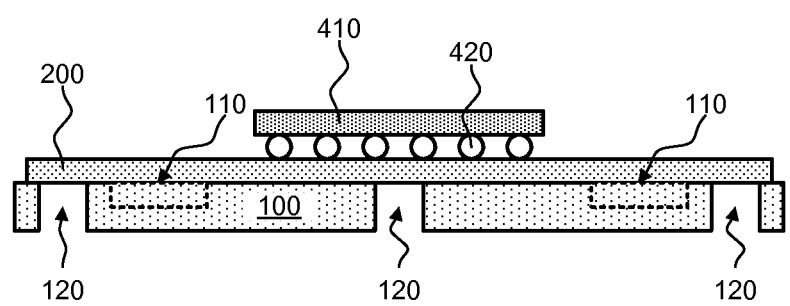
FIG. 4B is a cross-sectional view of the chip and the laminate of FIG. 4A, according to an embodiment of the present invention.

Referring to FIGS. 4A-4B, a microelectronic chip 410 may be placed above to the laminate 200. A plurality of solder balls 420 may be placed between a plurality of electrical contacts (not shown) in the microelectronic chip 410 to a plurality of electrical contacts (not shown) in the laminate 200. The microelectronic chip 410 may be joined to the laminate 200 using any means typically known in the art, but the solder balls 420 may not be reflowed until the laminate is held in place by magnets, as described below in conjunction with FIGS. 5A-5B.

Figure 5A:
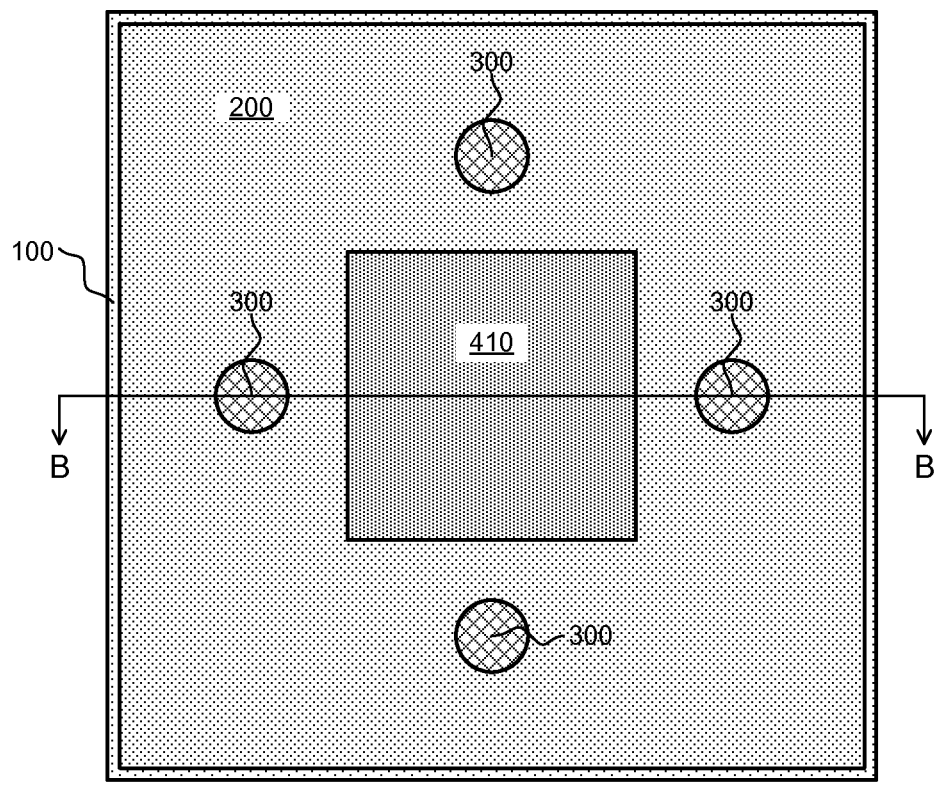
FIG. 5A is a top view of magnets placed on the laminate on the backing plate, according to an embodiment of the present invention.
Figure 5B:
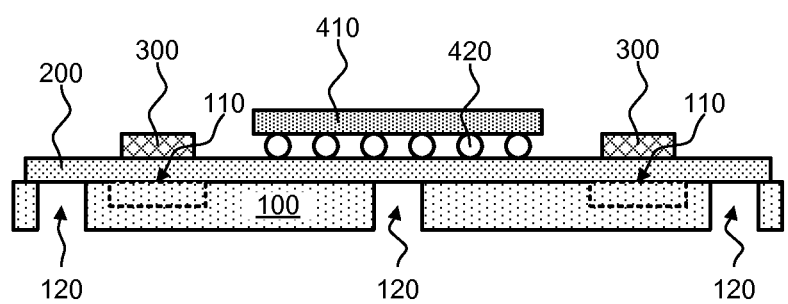
FIG. 5B is a cross-sectional view of the backing plate and the laminate of FIG. 5A, according to an embodiment of the present invention.

Referring to FIGS. 5A-5B, one or more magnets 300 may be placed above the laminate 200 around the microelectronic chip 410 to further hold the laminate 200 flat against the base plate 100. In other embodiments, the magnets 300 may be placed above the laminate 200 before the microelectronic chip 410. In such embodiments, the magnets 300 may be arranged above the laminate 200 as to leave a space for the microelectronic chip 410. The polarity of the magnets 300 may be such that an attractive force is generated between the magnets 300 and the ferromagnetic regions 110 of the base plate 100. The attractive force may help maintain flatness of the laminate 100 by holding the laminate 100 against the base plate 100. The total attractive force may be such to maintain laminate flatness without pinching the laminate 200 and preventing the laminate from expanding horizontally during reflow. In an exemplary embodiment, the magnets 300 may have a diameter of approximately 1 mm, but smaller and larger magnets are explicitly contemplated. The total area of the magnets 300 may be determined based on the necessary force required to prevent the laminate 200 from warping.

Because the laminate 100 may be subjected to potentially high temperatures during the reflow process, the magnets 300 may be made of a high Curie temperature material so that the attractive force is maintained at high temperature. In some embodiments, the Curie temperature of the magnets may be at least approximately 750° Celsius with a maximum operating temperature (i.e., the maximum temperature at which sufficient magnetic force is still generated) of at least approximately 250° Celsius. Exemplary suitable high Curie temperature materials may include samarium-cobalt and aluminum-nickel-cobalt, as well as certain grades of ceramic magnets.

While FIGS. 5A-5B depict four magnets arranged with one magnet on each side of the microelectronic chip 410, other embodiments may include as few as one magnet or greater than 4 magnets. The magnets 300 may further be arranged in a number of different configurations, as further described below in conjunction with FIGS. 6A-6F.

Once the magnets 300 are in place, the laminate 200 and the microelectronic chip 410 may be placed in a reflow furnace to melt the solder balls 420 and join the laminate 200 to the microelectronic chip 410. In an exemplary embodiment, the microelectronic chip 410 and the laminate 200 may be joined in a $N_2$ furnace atmosphere in the presence of flux at a peak temperature of approximately 235° Celsius to 255° Celsius for approximately 30 seconds to 2 minutes, 30 seconds. Once the reflow process is complete, the magnets 300 may be removed from above the laminate 200. The magnets 300 may be removed, for example, by hand. In other embodiments, an electromagnet (not shown) may be applied to the magnets 300 to neutralize the attraction between the magnets 300 and the base plate 100 to aid in removing the magnets 300. The laminate 200 may be removed from above the base plate 100, or may remain on the base plate 100 during subsequent fabrication processes.

Figure 6A:
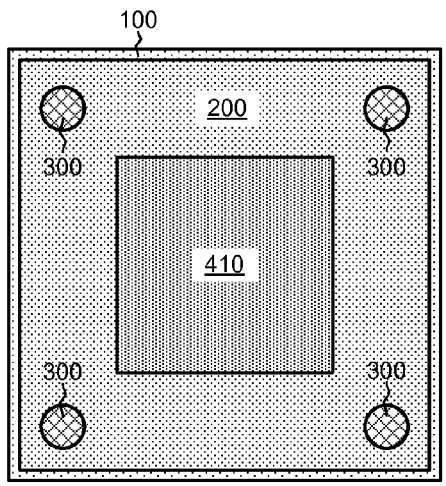
FIGS. 6A-6F are top views of the chip joined to the laminate, where the laminate is held to a back plate by magnets in different configurations, according to embodiments of the present invention.
Figure 6B:
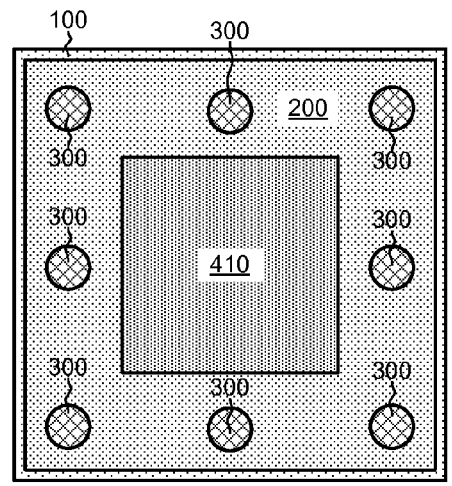
Figure 6C:
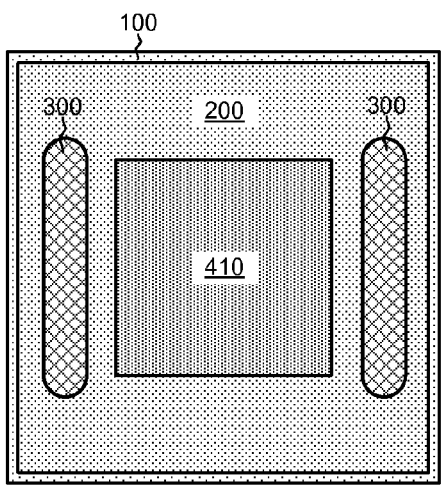
Figure 6D:
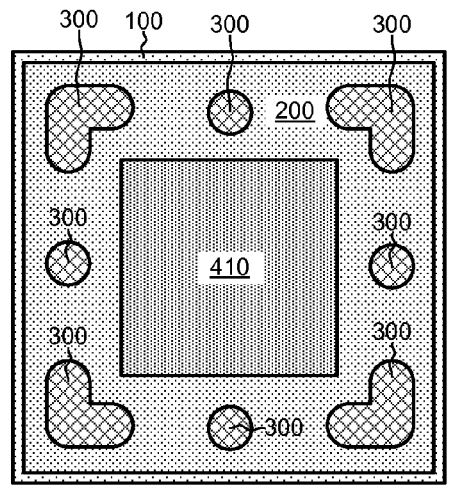
Figure 6E:
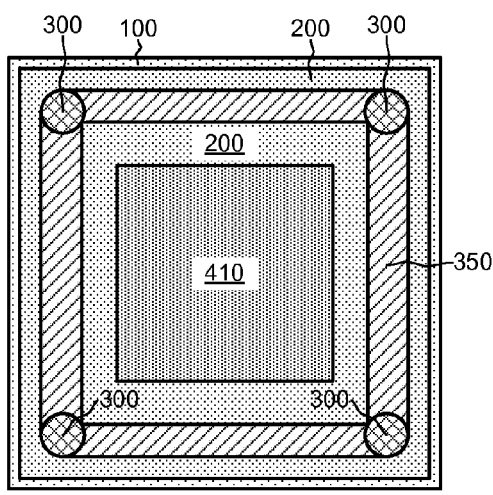
Figure 6F:
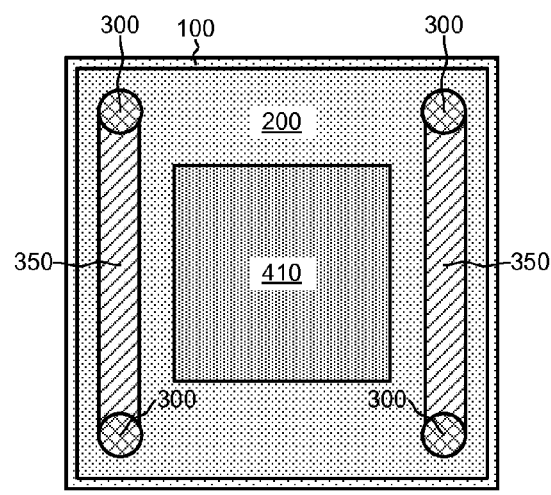

FIGS. 6A-6F depict a number of additional possible configurations of the magnets 300, as discussed above in conjunction with FIGS. 5A-5B. Referring to FIG. 6A, the magnets 300 may be placed at the corners of the laminate 200, rather than along the sides. Referring to FIG. 6B, the magnets 300 may be placed at both the corners and sides of the laminate 200. While both FIGS. 6A-6B depict the magnets 300 arranged in a symmetrical manner, asymmetrical arrangements are also specifically contemplated, for example to avoid interfering with other electrical devices formed within the laminate (e.g., capacitors) (not shown). In further embodiments, such as those depicted in FIGS. 6C-6D, some or all of the magnets 300 may be shapes other than round. In further embodiments, such as those depicted in FIGS. 6E-6F, some or all of the magnets 300 may be joined by support structures 350. The support structures 350 may be made of any suitable material that may aid in placing and removing the magnets 300 from above the laminate 200.

Figure 7A:
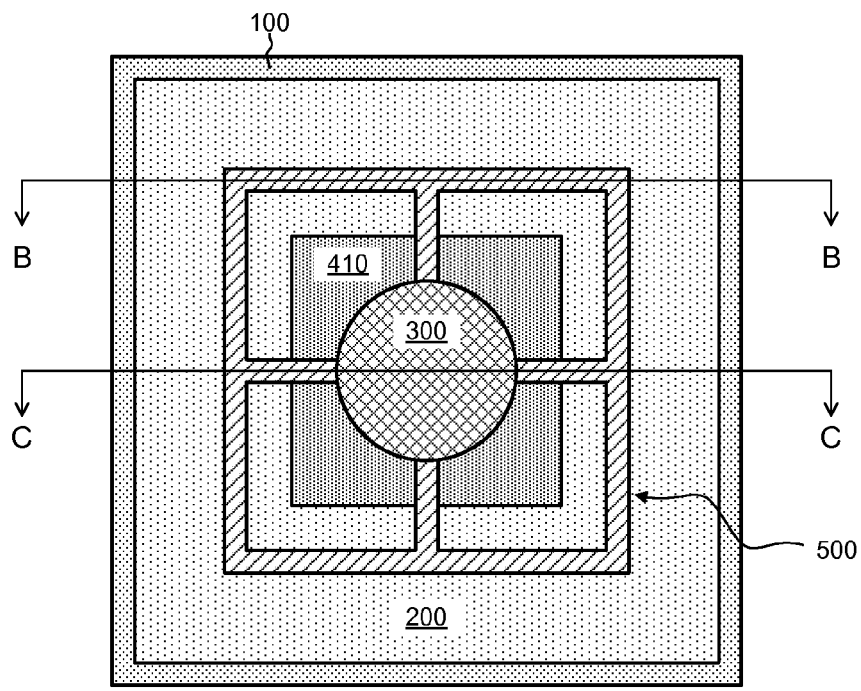
FIG. 7A, is a top view of a chip joined to the laminate held to a backing plate by a magnet held above the laminate by a magnet carrier, according to an embodiment of the present invention.
Figure 7B:
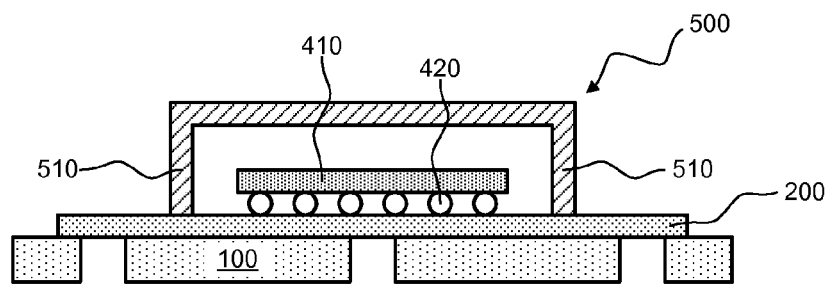
FIGS. 7B-7C are cross-sectional views of the chip joined to the laminate of FIG. 7A, according to embodiments of the present invention.
Figure 7C:
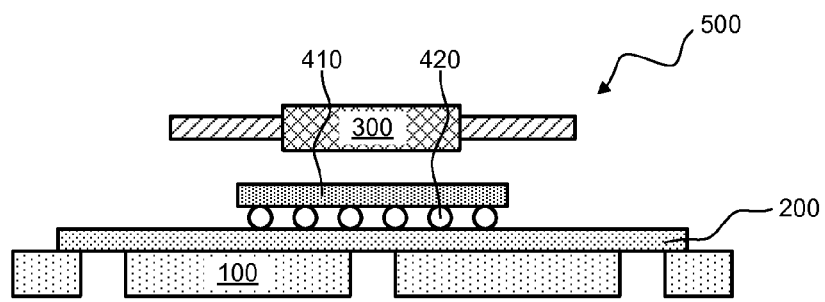

As described below in conjunction with FIGS. 7A-7C, in another embodiment, the one or more magnets 300 may be contained by a magnet carrier 500 which suspends the magnets 300 above the laminate 200 by a plurality of carrier legs 510. Due to the attractive force between the base plate 100 and the magnets 300, the magnet carrier 500 is pulled down and applies pressure to the laminate 200 through the carrier legs 510. By using the magnet carrier 500 to raise the magnets 300 above the surface of the laminate 200, it may become easier to access the sides of the microelectronic chip 410, for example to apply underfill epoxy between the microelectronic chip 410 and the laminate 200. While the magnet carrier depicted in FIGS. 7A-7C includes just a single magnet, other embodiments may include magnet carriers having two or more magnets. Further, the configuration of the carrier legs 510 may vary in order to apply the desired pressure to the laminate 200.

As described below in conjunction with FIGS. 8A-10B, embodiments of the invention are generally relate to methods of maintaining laminate flatness during a chip join process by placing magnets above the laminate that hold the laminate flat against a magnetic backing plate. In FIGS. 8A-10B, a first group of magnets may be placed above the laminate. A second group of magnets that repel the first group of magnets may then be placed above the first group of magnets so that the first group of magnets presses against the laminate. Referring to FIGS. 8A-10B, figures with the suffix "B" are cross-sectional views of the exemplary structure along the plane indicated by line B-B of the corresponding figure with the same numeric label and the suffix "A".

Figure 8A:
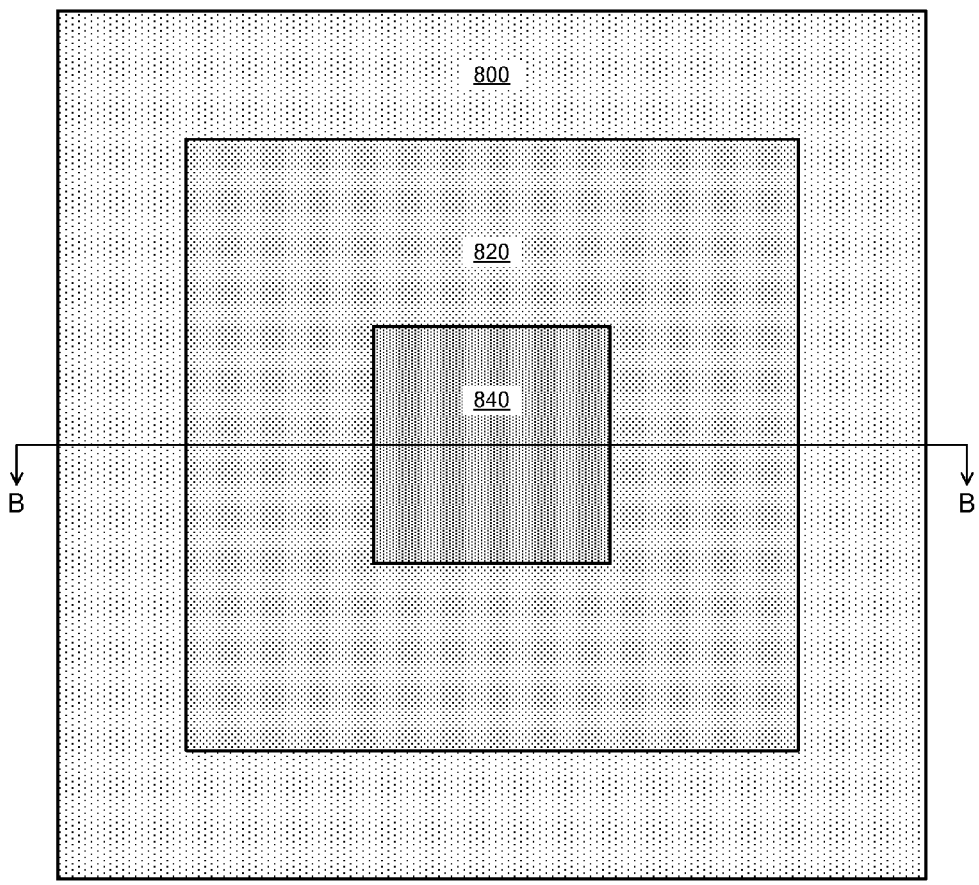
FIG. 8A is a top view of a chip joined to the laminate, according to an embodiment of the present invention.
Figure 8B:
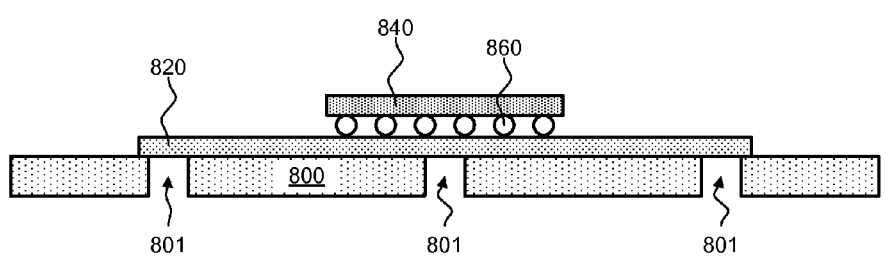
FIG. 8B is a cross-sectional view of the chip joined to the laminate of FIG. 8A, according to an embodiment of the present invention.

Referring to FIGS. 8A-8B, a laminate 820 may be placed above a base plate 800. The laminate 820 may be substantially similar to the laminate 200 described above in conjunction with FIGS. 3A-3B. The base plate 800 may be substantially similar to the base plate 100 described above, for example including vacuum holes 801, but the base plate 800 may not include any ferromagnetic regions. After the laminate 820 is placed above the base plate 800, a microelectronic chip 840 may be placed above the laminate 820 and a plurality of solder balls 860 may be placed between the laminate 820 and the microelectronic chip 840. The microelectronic chip 840 and the solder balls 860 may be substantially similar to the microelectronic chip 410 and the solder balls 420, respectively.

Figure 9A:
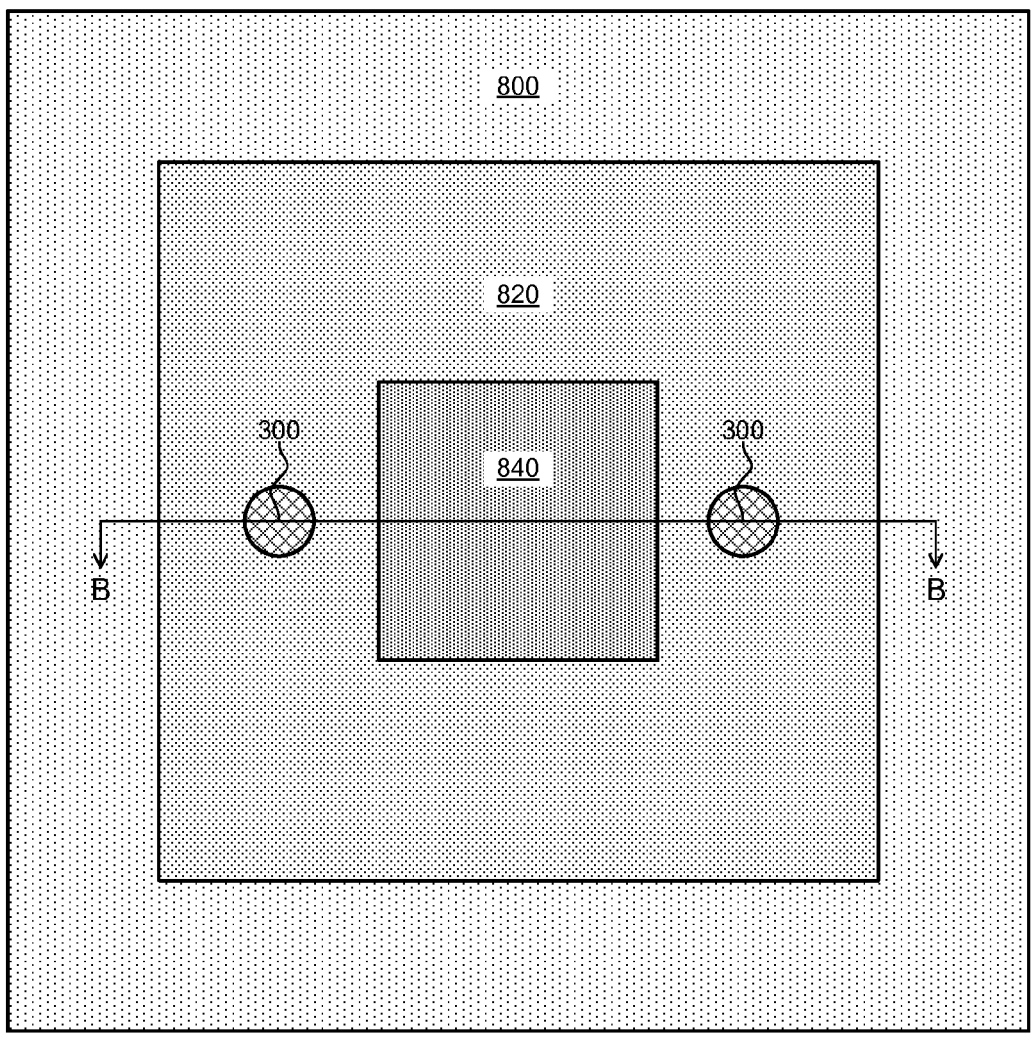
FIG. 9A is a top view of a first group of magnets placed above the laminate of FIG. 8A, according to an embodiment of the present invention.
Figure 9B:
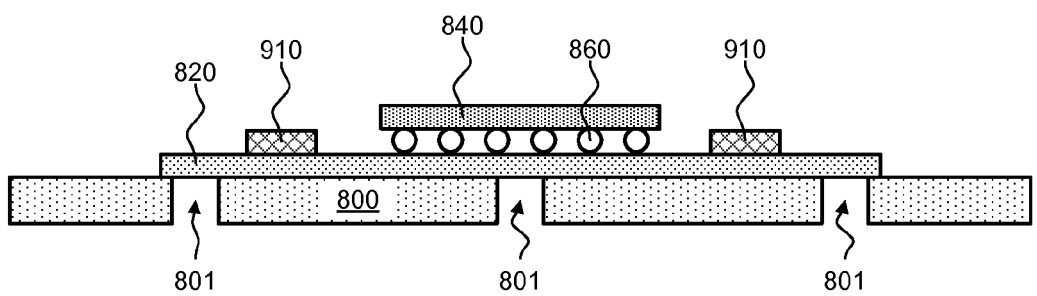
FIG. 9B is a cross-sectional view of the first group of magnets of FIG. 9A placed above the laminate; according to an embodiment of the present invention.

Referring to FIGS. 9A-9B, a first group of magnets 910 may be placed above the laminate 820. The first group of magnets 910 may be substantially similar to the magnets 300 as described above in conjunction with FIGS. 5A-5B. While the first group of magnets 910 is depicted in FIGS. 9A-9B as including two magnets, other embodiments may include as few as one or more than two magnets. The first group of magnets 910 may be arranged around the microelectronic chip 840 in any configuration, such as those depicted in FIGS. 6A-6F.

Figure 10A:
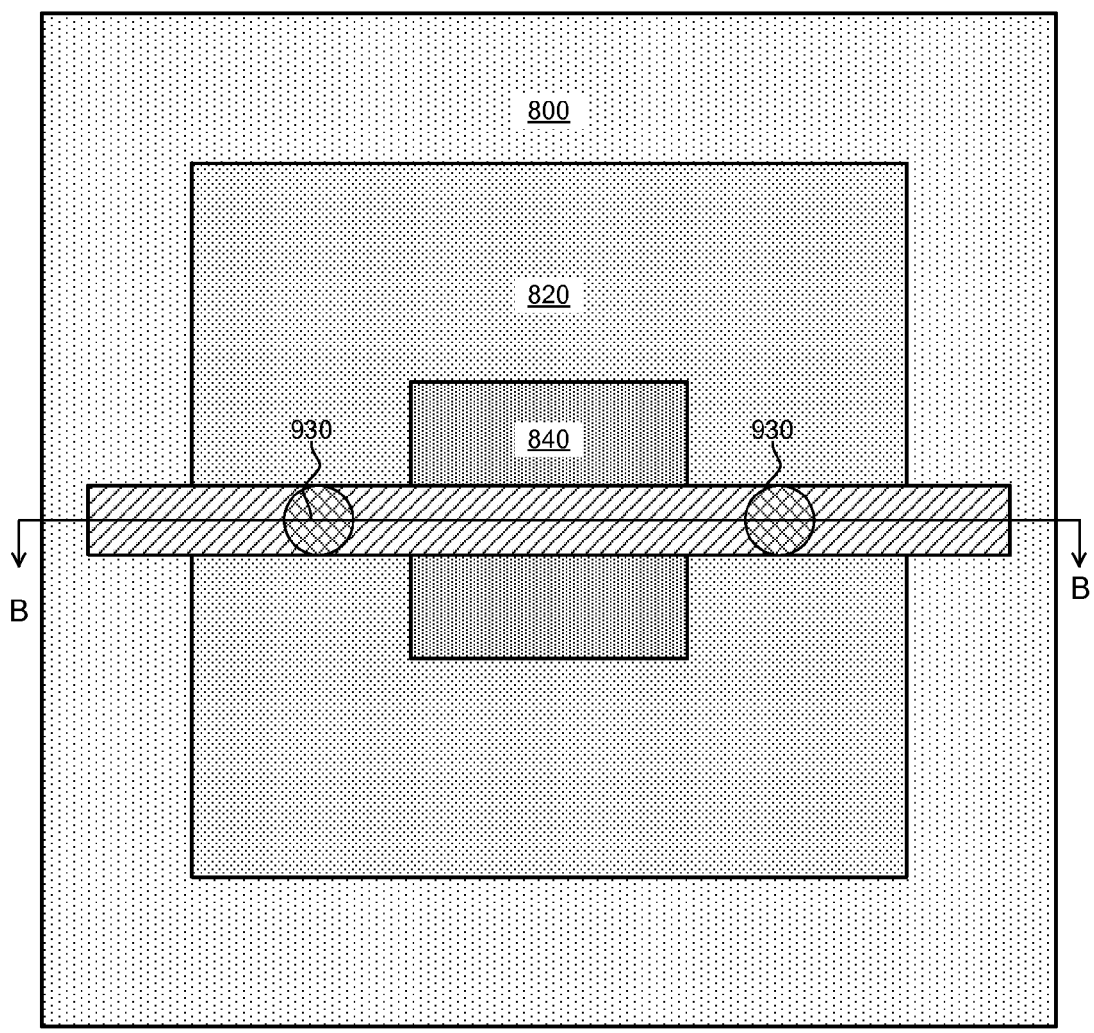
FIG. 10A is a top view of a second group of magnets placed above the first group of magnets of FIG. 9A, according to an embodiment of the present invention.
Figure 10B:
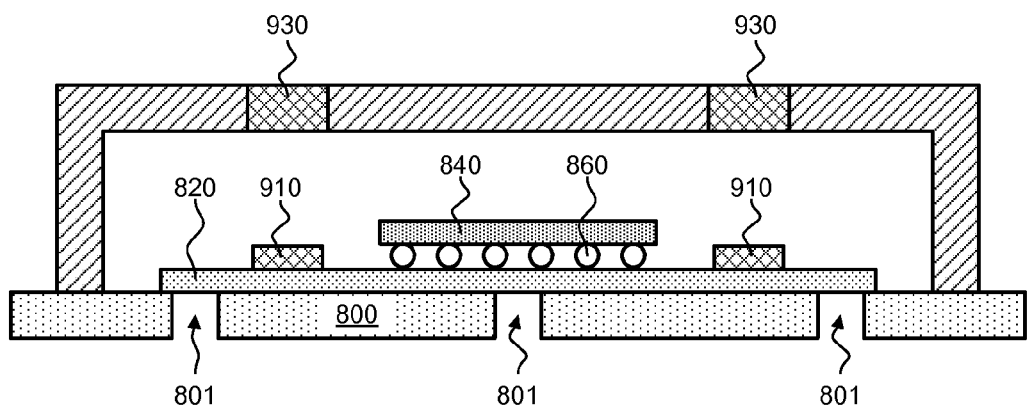
FIG. 10B is a cross-sectional view of a second group of magnets of FIG. 10A placed above the first group of magnets, according to an embodiment of the present invention.

Referring to FIGS. 10A-10B, a second group of magnets 930 may be placed above the first group of magnets 910. The second group of magnets 930 may be made of substantially the same material as the first group of magnets 910. While the second group of magnets 930 is depicted in FIGS. 10A-10B as including two magnets, other embodiments may include as few as one or more than two magnets.

The second group of magnets 930 may be held above the first group of magnets 910 using any suitable method. In the embodiment depicted in FIGS. 10A-10B, the second group of magnets 930 are held above the first group of magnets 910 by a magnet carrier 950 similar to the magnet carrier 500 described above in conjunction with FIGS. 7A-7B. In other embodiments, the second group of magnets 930 may be held by other means including, for example, by being incorporated into the ceiling of the reflow furnace used to melt the solder balls 860, as described below.

The bottoms of the second group of magnets 930 may have the same polarity as the tops of the first group of magnets 910 so that a repulsive force is generated between the first group of magnets 910 and the second group of magnets 930. The repulsive force may push the first group of magnets 910 against the laminate 820, so that laminate 820 is held flat against the base plate 800.

Once first group of magnets 910 and the second group of magnets 930 are in place, the laminate 820 and the microelectronic chip 840 may be placed in a reflow furnace to melt the solder balls 860 and join the laminate 820 to the microelectronic chip 860. The reflow process may be substantially similar to the reflow process described above in conjunction with FIGS. 5A-5B.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

The invention claimed is:

1. A method of preventing laminate warpage, the method comprising:
   placing a laminate on a back plate; and
   applying a magnetic force to the laminate comprising:
      placing a magnet above the laminate, wherein an attractive force generated between the magnet and a ferromagnetic region of the back plate pulls the magnet against the laminate, thereby holding the laminate flat against the back plate.

2. The method of claim 1, further comprising:
   placing a microelectronic chip above the laminate;
   placing a plurality of solder balls between the microelectronic chip and the laminate; and
   melting the plurality of solder balls to join the microelectronic chip to the laminate.

3. The method of claim 2, wherein melting the plurality of solder balls occurs at below the Curie temperature of the magnet.

4. The method of claim 1, wherein the magnet has Curie temperature higher than approximately 750° Celsius and a maximum operating temperature higher then approximately 250° Celsius.

5. The method of claim 1, wherein the magnet comprises samarium-cobalt.

6. The method of claim 1, wherein the magnet comprises two or more magnets joined by a support structure.

7. A method of preventing laminate warpage, the method comprising:
   placing a laminate on a back plate; and
   applying a magnetic force to the laminate comprising:
      placing a first magnet above the laminate; and
      placing a second magnet above the first magnet, wherein a repulsive force generated between the first magnet and the second magnet pushes the first magnet against the laminate, thereby holding the laminate flat against the back plate.

8. The method of claim 7, wherein the first magnet and the second magnet have Curie temperatures higher than approximately 750° Celsius and maximum operating temperatures higher then approximately 250° Celsius.

9. The method of claim 7, wherein the first magnet and the second magnet comprise samarium-cobalt.

10. The method of claim 7, further comprising:
    placing a microelectronic chip above the laminate;
    placing a plurality of solder balls between the microelectronic chip and the laminate; and
    melting the plurality of solder balls to join the microelectronic chip to the laminate.

11. A method of preventing laminate warpage during a chip-joining process, the method comprising:
    placing a laminate on a back plate, wherein the back plate contains a ferromagnetic region;
    placing a microelectronic chip above the laminate;
    placing a plurality of solder balls between the microelectronic chip and the laminate; and
    placing a magnet carrier on the laminate, wherein the magnet carrier comprises a plurality of carrier legs and a magnet held above laminate by the plurality of carrier legs,
    wherein an attractive force generated between the magnet of the magnet carrier and the ferromagnetic region of the base plate pulls the magnet carrier against the laminate.

12. The method of claim 11, wherein the magnet has a Curie temperature higher than approximately 750° Celsius and a maximum operating temperature higher then approximately 250° Celsius.

13. The method of claim 11, wherein the magnet comprises samarium-cobalt.

14. The method of claim 11, further comprising melting the solder balls to join the microelectronic chip and the laminate, wherein melting the solder balls occurs at a temperature less than the Curie temperature of the magnet.

15. A method of preventing laminate warpage during a chip-joining process, the method comprising:
    placing a laminate on a back plate;
    placing a microelectronic chip above the laminate;
    placing a plurality of solder balls between the microelectronic chip and the laminate;
    placing a first magnet above the laminate; and
    placing a second magnet above the first magnet, where a repulsive force generated between the first magnet and the second magnet pushes the first magnet against the laminate.

16. The method of claim 15, wherein the first magnet and the second magnet have Curie temperatures higher than approximately 750° Celsius and maximum operating temperatures higher then approximately 250° Celsius.

17. The method of claim 15, wherein the first magnet and the second magnet comprise samarium-cobalt.

18. The method of claim 15, wherein opposing surfaces of the first magnet and the second magnet have the same polarity.

19. The method of claim 15, further comprising:
    melting the solder balls to join the microelectronic chip and the laminate, wherein melting the solder balls occurs at a temperature less than the Curie temperatures of the first magnet and the second magnet.

* * * * *